United States Patent [19]
Veteran et al.

[11] Patent Number: 5,552,701
[45] Date of Patent: Sep. 3, 1996

[54] DOCKING SYSTEM FOR AN ELECTRONIC CIRCUIT TESTER

[75] Inventors: David R. Veteran; Joel D. Bickford; Julius K. Botka, all of Santa Rosa,, Calif.

[73] Assignee: Hewlett-Packard Company, Palo Alto, Calif.

[21] Appl. No.: 441,563

[22] Filed: May 15, 1995

[51] Int. Cl.⁶ .............................. G01R 1/73; G01R 1/04; G01R 1/067; G01R 15/12
[52] U.S. Cl. ........................................ 324/158.1; 324/72.5
[58] Field of Search ................................ 324/158.1, 750, 324/751, 752, 753, 763, 754, 72.5, 762; 439/653

[56] References Cited

U.S. PATENT DOCUMENTS

| | | | |
|---|---|---|---|
| 4,665,360 | 5/1987 | Phillips | 324/72.5 |
| 4,862,077 | 8/1989 | Horel et al. | 324/72.5 |
| 5,264,787 | 11/1993 | Woith et al. | 324/72.5 |
| 5,416,429 | 5/1995 | McQuade et al. | 324/72.5 |

*Primary Examiner*—Kenneth A. Wieder
*Assistant Examiner*—Barry C. Bowser

[57] ABSTRACT

An electronic circuit test system for measuring the response to electrical signals applied to an electronic circuit under test is provided with a docking system for facilitating mechanical and electrical connections. A docking cone is mounted to a fixture board of the electronic circuit test system. The docking cone enters a tunnel in a test head of the electronic circuit test system as the fixture board is moved toward the test head. The docking cone guides connectors mounted to the fixture board into connection with mating connectors mounted to a load board and a connector support disk comprising the test head. The docking system increases the repeatability and reliability of mechanical and electrical connections and reduces the risk of damage to electrical connectors of the electronic circuit test system.

9 Claims, 7 Drawing Sheets

DOCKING SYSTEM FOR AN ELECTRONIC CIRCUIT TESTER

BACKGROUND OF THE INVENTION

This invention relates to systems for testing electronic circuits by applying and/or measuring electrical signals and, more particularly, to electronic circuit test systems for applying electrical signals to a device or integrated circuit being tested and measuring the response of the device or integrated circuit to the applied electrical signals. Specifically, the invention is directed to a system for facilitating mechanical and/or electrical connections between an electronic circuit tester and an electronic circuit, such as a device or integrated circuit, being tested so that electrical signals can be transmitted to and/or received from the electronic circuit for characterizing the performance of the electronic circuit. More specifically, one embodiment of the invention provides a docking system for effecting mechanical and/or electrical connections between a fixture board of an electronic circuit tester and a load board and/or a test head of the tester so that electrical signals can be transmitted to and/or received from the electronic circuit for characterizing the performance of the electronic circuit. The docking system in accordance with one embodiment of the invention is particularly adaptable to a high-frequency electronic circuit tester for effecting mechanical and electrical connections between the fixture board and the load board and/or test head of the tester to improve the reliability and repeatability of connections.

Programmable electronic circuit testers are typically used during the manufacture of electronic devices and integrated circuits to test the performance of the device or integrated circuit being manufactured. Tests are conducted to assure that the device or integrated circuit satisfies associated design performance specifications. In order to test the device or integrated circuit, the electronic circuit tester is programmed to inject an electrical signal or suite of electrical signals into the device or integrated circuit under test and to measure the response(s). The electronic circuit tester cannot only be used to test finished packaged devices and integrated circuits, but is also frequently used to perform tests at various stages of the manufacture of the device or integrated circuit between initial wafer processing and final packaging.

A conventional programmable electronic circuit tester, generally indicated by the numeral 10, is shown in FIG. 1. The electronic circuit tester 10 comprises a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, a network analyzer, spectrum analyzer, oscilloscope, or other waveform digitizing and/or signal processing equipment, for measuring the response(s) to those applied electrical signals. The test head 12 can include circuitry which performs distribution of electrical signals, signal separation, frequency translation, amplification, attenuation, switching, or other conditioning or modification of electrical signals prior to being routed to the rack 16 or to a device or integrated circuit being tested.

As shown in FIG. 1, the test head 12 interfaces to a device or integrated circuit through a load board 18 and in turn through a fixture board 20 typically mounted to the test head. Alternatively, prior to installation of the fixture board 20, a calibration board (not shown) having a configuration similar to the fixture board can be connected to the test head 12 for calibrating the test head. The configuration of the load board 18 depends on the type or family of device or integrated circuit being tested, such as an analog or digital electronic circuit, while the configuration of the fixture board 20 is typically specific to the family or particular device or integrated circuit being tested.

As shown in FIG. 1, the fixture board 20 is in turn interfaced to a device-under-test (DUT) board 22 that comprises inductors, capacitors, and/or other electronic components or circuits mounted to or fabricated on the DUT board for decoupling, filtering, attenuating, or otherwise modifying electrical signals transmitted to and/or received from a device or integrated circuit being tested. Finally, the DUT board 22 is connected to a socket 24 for effecting an electrical connection(s) between the electronic circuit tester 10 and the actual electronic circuit being tested, such as a packaged device or integrated circuit 26.

As also shown in FIG. 1, the test head 12 is mounted to a dolly 28. The test head 12 is preferably mounted by pivotable connections 30 to the dolly 28. The pivotable connections 30 enable the test head 12 to be positioned in an approximately upward facing horizontal position so that the appropriate load board 18 and calibration or fixture board 20 and DUT board 22 with the socket 24 can be mounted to the test head of the electronic circuit tester 10 by an operator. The test head 12 can also be pivoted to any angular position so that the socket 24 can interface with an automated material handler 32, for example, which rapidly feeds each packaged device or integrated circuit 26 to the electronic circuit tester 10 to be tested.

Alternatively, a wafer probe (not shown) can be substituted for the socket 24 mounted to the DUT board 22. The pivotable connections 30 enable the test head 12 to be pivoted to an inverted position to test devices or integrated circuits on a wafer (not shown) at a wafer probing station (not shown).

In order to interface the socket 24 to the automated material handler 32, or a wafer probe (not shown) at a wafer probing station (not shown), a frame 34 is mounted to the test head 12. A jig 36 that mates with the frame 34 is mounted to the automated material handler 32 or wafer probing station (not shown) to align the test head 12 with the handler or station so that the socket 24 or a wafer probe (not shown), respectively, contacts the device or integrated circuit to be tested.

Unfortunately, the test head 12 is typically massive and difficult for the operator to manipulate. Therefore, it is problematic for the operator to align the socket 24 with respect to the automated material handler 32 or a wafer probing station (not shown) so that packaged devices or integrated circuits or devices or integrated circuits on wafer can be tested.

It would therefore be desirable to provide a structure to facilitate alignment of the socket 24 with the automated material handler 32 or facilitate alignment of a wafer probe (not shown) at a wafer probing station (not shown). Such a structure would facilitate setup and improve the repeatability and reliability of contact between the electronic circuit tester 10 and a device or integrated circuit during actual testing.

SUMMARY OF THE INVENTION

One embodiment of the invention provides a docking system for facilitating mechanical and/or electrical connections in an electronic circuit test system so that the test system can be easily interfaced with an automated material handler or a wafer probing station to efficiently set up the test system and test devices or integrated circuits. In accordance with one embodiment of the invention, the docking system is incorporated between a fixture board of the electronic circuit test system and a test head of the test system. The fixture board preferably comprises a pulldown ring and at least one electrical connector mounted to the fixture board. Additionally, the test head preferably comprises a load board selectively mounted to the test head and having an aperture, a connector support disk mounted to the test head within the aperture and having an opening, at least one mating electrical connector mounted to the load board or to the connector support disk, and a tunnel through the test head aligned with the opening. Preferably, a cam ring selectively engages the pulldown ring on the fixture board and the connector support disk and is actuable to interconnect the fixture board to the test head.

In one preferred embodiment of the invention, the docking system comprises male docking means incorporated into one of the fixture board and the test head. For example, the male docking means can comprise a spider connected to the pulldown ring of the fixture board. The male docking means can further comprise a docking cone having a first end and a second end, the second end of the docking cone being mounted to the spider, the first end of the docking cone being configured to interfit in female docking means incorporated into the other of the fixture board and the test head. In the example, the female docking means can comprise the opening in the connector support disk and the tunnel in the test head. The male and female docking means facilitate engagement of the at least one connector of the fixture board with the at least one mating connector of the load board or test head when the fixture board is moved toward the test head.

In one implementation, the pulldown ring preferably comprises a plurality of pulldown pins, and the cam ring preferably comprises a plurality of bayonet slots into which are guided respective pulldown pins when the fixture board is moved toward the test head. Furthermore, the connector support disk is peripherally mounted with respect to the tunnel in the test head and has a plurality of peripheral notches, and the cam ring has a plurality of tabs that pass through the notches when the cam ring is mounted to the test head. Preferably, the periphery of the cam ring has at least one handle which can be grasped by an operator to rotate the cam ring when the pulldown pins are lodged in the bayonet slots to move the fixture board toward the test head. Additionally, when the cam ring is rotated, a gun breech connection is formed between the fixture board and the connector support disk of the test head. Also, the pulldown ring preferably comprises a plurality of holes, and the connector support disk preferably comprises a plurality of tapered dowel pins that interfit in respective holes in the pulldown ring to provide precise alignment between the fixture board and the test head as the docking cone guides the fixture board toward the test head.

Preferably, the spider comprises an annulus having a plurality of radial spokes, each spoke having an end distal from the annulus. The distal end of each spoke has a threaded hole. Also, the periphery of the pulldown ring has a plurality of holes for alignment with the distal ends of the spokes of the spider. A plurality of screws inserted through the holes in the periphery of the pulldown ring and screwed into the threaded ends of the spokes of the spider mounts the spider to the pulldown ring. Additionally, the face of each spoke of the spider opposite the fixture board is preferably relieved intermediate the annulus and the distal end to enable electrical components to be mounted to the fixture board between the fixture board and the spider.

The docking cone preferably has a circular cross-section, the first end of the docking cone being tapered outwardly toward the second end of the docking cone. The first end of the docking cone has a first diameter and the second end of the docking cone has a second diameter, the first diameter being less than the second diameter and the second diameter being less than a diameter of the opening in the connector support disk, the second end of the docking cone being mounted to the annulus.

Finally, the second end of the docking cone can have a shoulder so that the second end of the docking cone interfits into the annulus. Additionally, the annulus can have a plurality of holes, and the second end of the docking cone can have a plurality of threaded holes. A plurality of screws inserted through the holes in the annulus and screwed into the threaded holes in the docking cone can mount the docking cone to the spider.

The docking system in accordance with the invention facilitates setup of the electronic circuit test system when the test system is interfaced with an automated material handler or a wafer probing station. The docking system also increases the repeatability and reliability of mechanical and/or electrical connections within the electronic circuit test system, as well as between the test system and a device or integrated circuit being tested.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings.

DETAILED DESCRIPTION OF THE PREFERRED EMBODIMENTS

Figure 1:
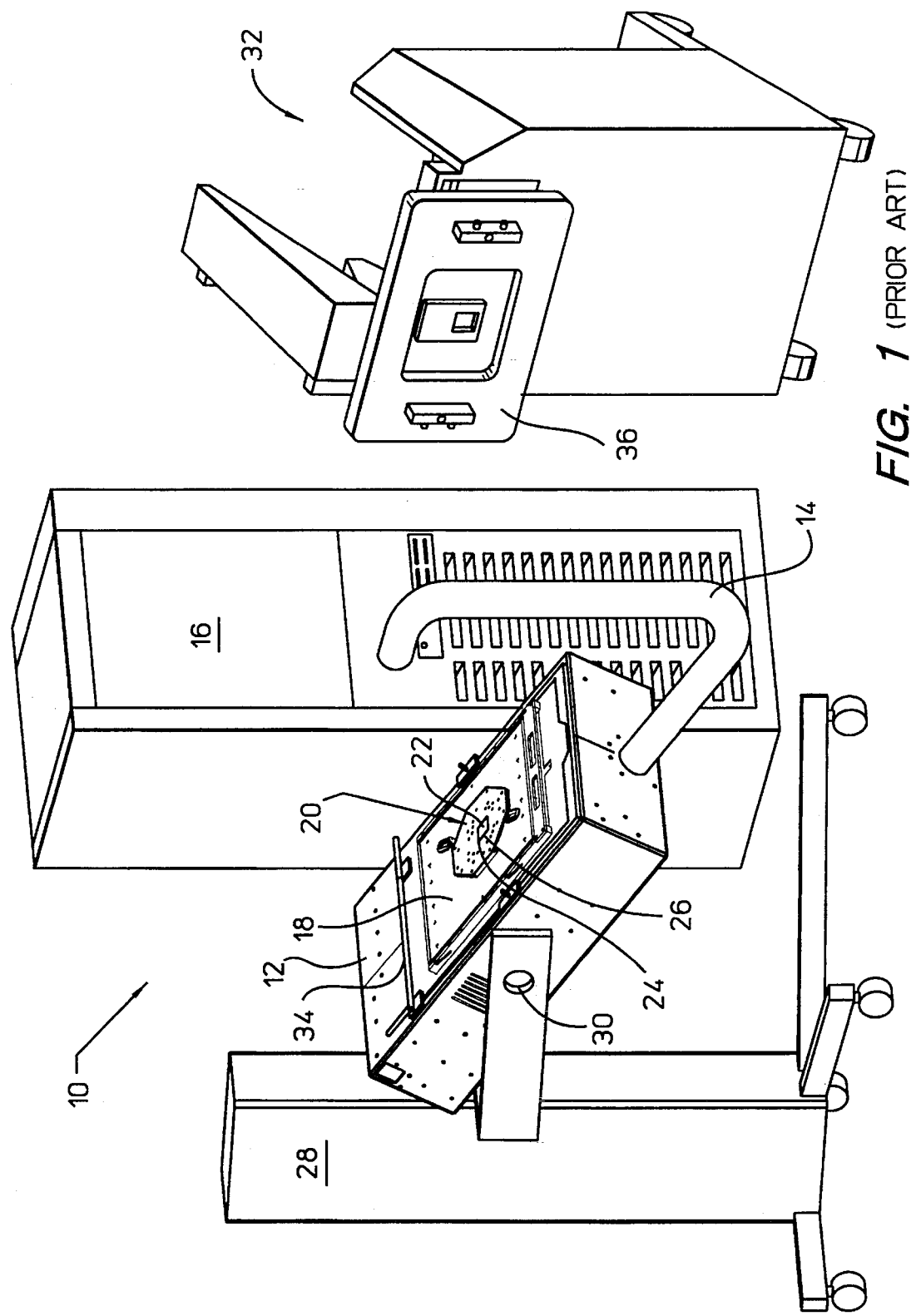
FIG. 1 is an isometric view of a conventional electronic circuit tester.
Figure 2:
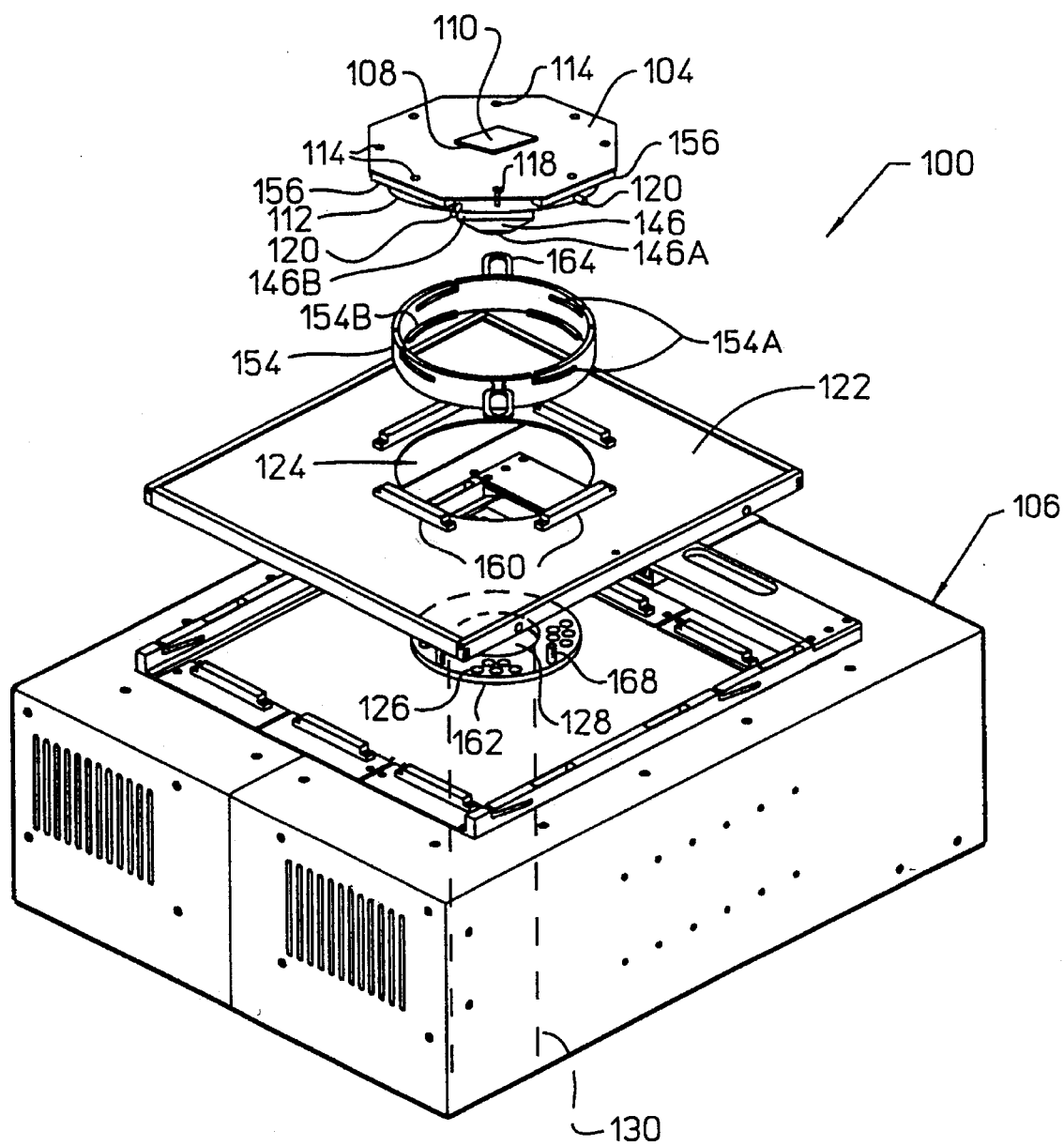
FIG. 2 is an exploded view of a test head, load board, and fixture board of an electronic circuit test system, which incorporate the docking system in accordance with one embodiment of the invention.
Figure 6:
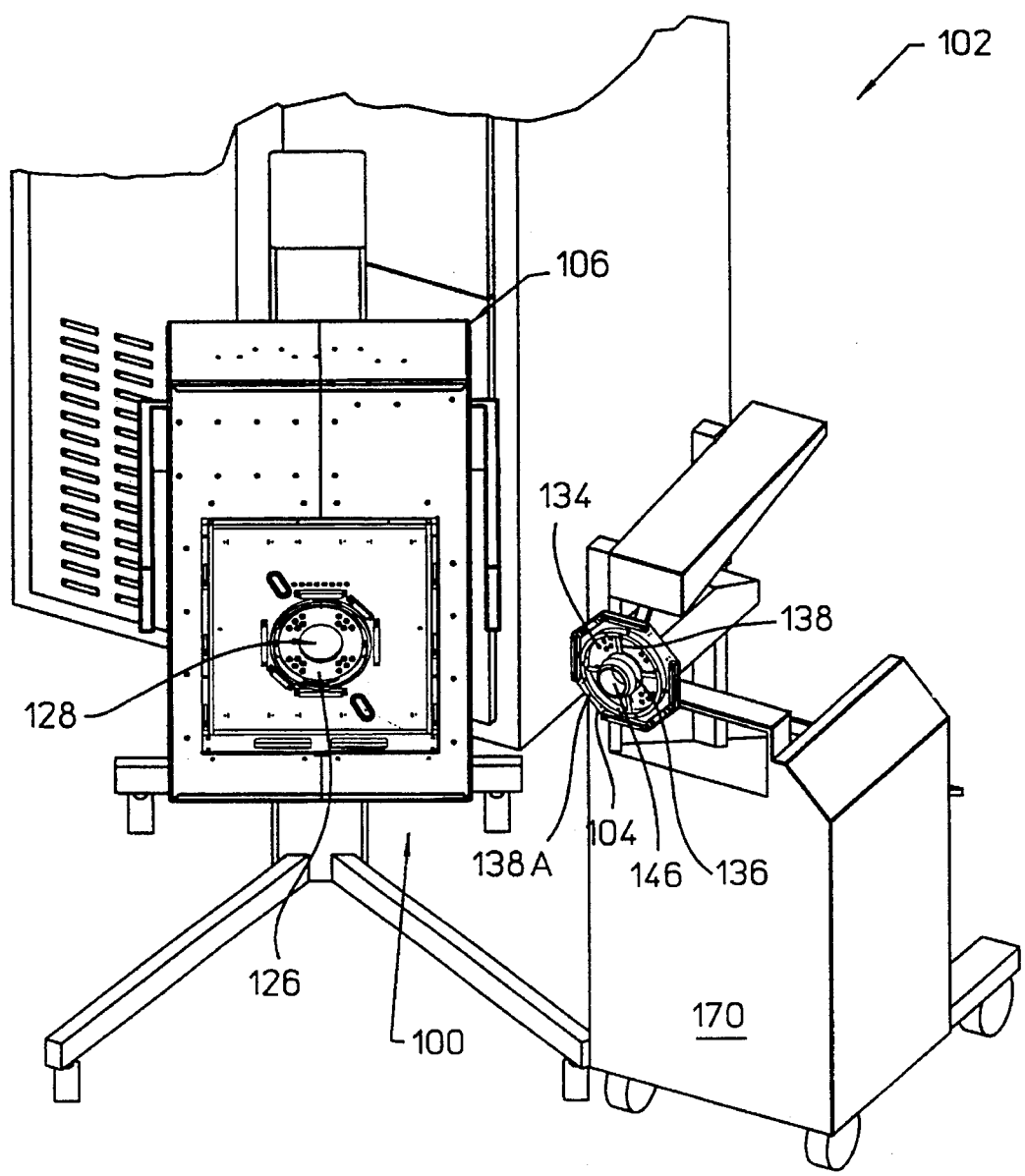
FIG. 6 illustrates deployment of the docking system in accordance with one embodiment of the invention to test packaged devices or integrated circuits fed by an automated material handler.
Figure 7:
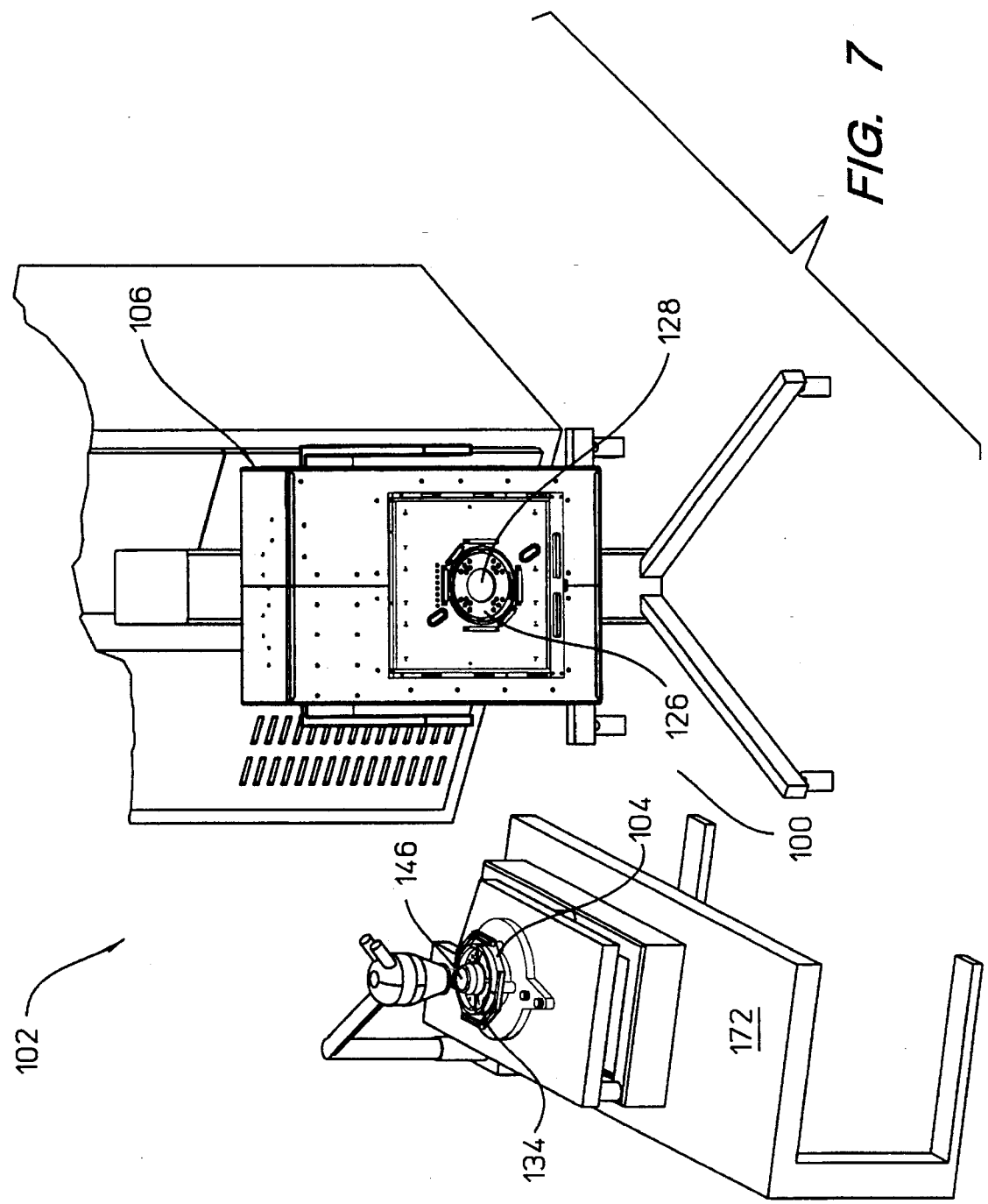
FIG. 7 illustrates deployment of the docking system in accordance with one embodiment of the invention at a wafer probing station to test devices or integrated circuits on wafer.

In accordance with one embodiment of the invention, a docking system, generally indicated by the numeral 100 in FIGS. 2, 6, and 7, is provided in an electronic circuit test system 102 for interconnecting a fixture board 104 of the test system to a test head 106 of the test system. As shown in FIG. 2, a device-under-test (DUT) board 108 is incorporated into the fixture board 104. Also, a socket 110 is incorporated into the DUT board 108 for contacting leads of a packaged device or integrated circuit (not shown) during actual testing and connecting the leads to the DUT board.

Figure 3:
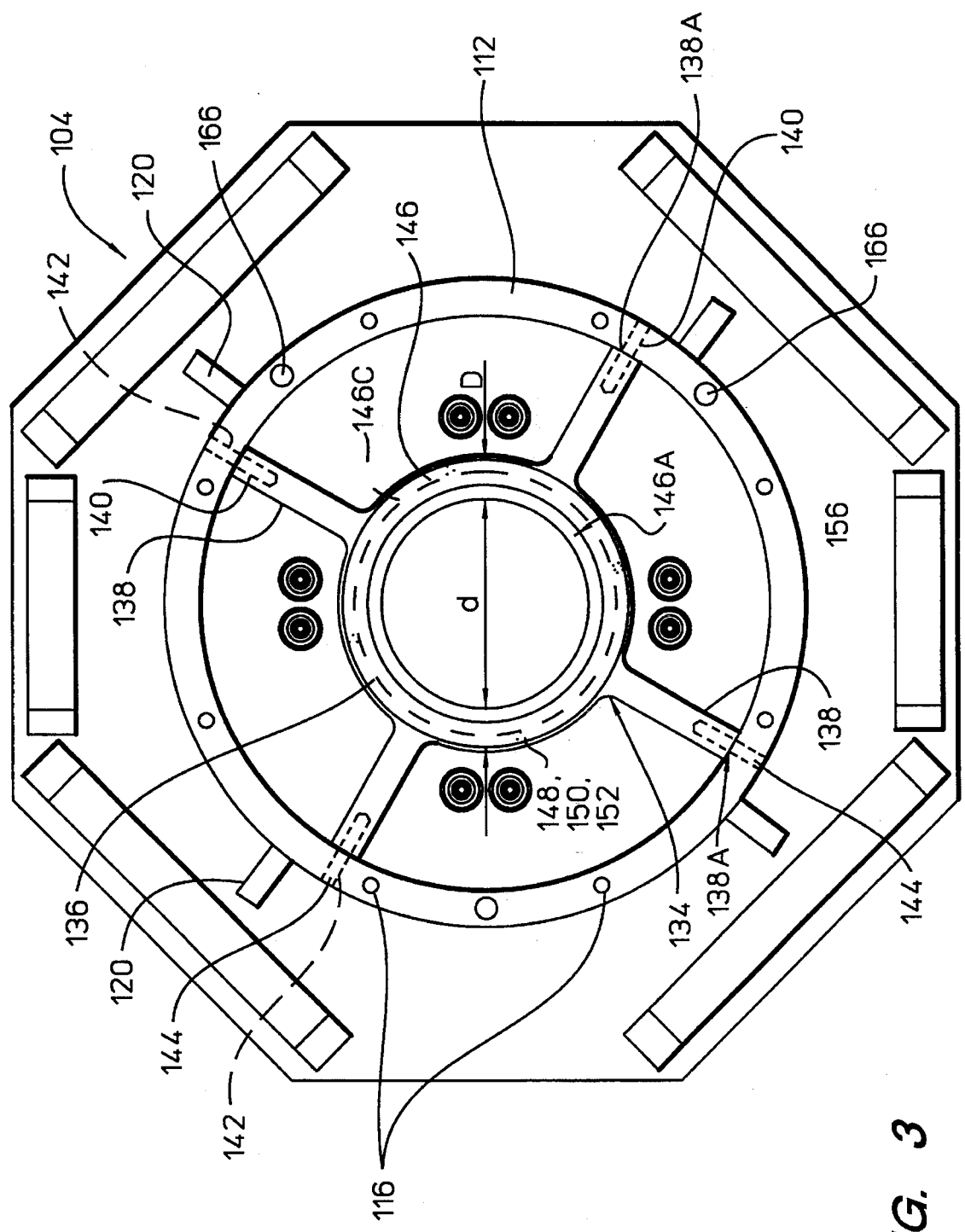
FIG. 3 is a detail of a docking cone and spider comprising the docking system in accordance with one embodiment of the invention shown in FIG. 2.

As shown in FIGS. 2 and 3, the fixture board 104 comprises a pulldown ring 112 mounted to the fixture board. The fixture board 104 has a plurality of holes 114. The pulldown ring 112 has a plurality of threaded holes 116. A plurality of flathead screws 118 inserted through the holes 114 in the fixture board 104 and screwed into the threaded holes 116 in the pulldown ring 112 mounts the pulldown ring to the fixture board. The pulldown ring 112 preferably further comprises a plurality of pulldown pins 120 that extend radially outwardly from the periphery of the pulldown ring.

Figure 4:
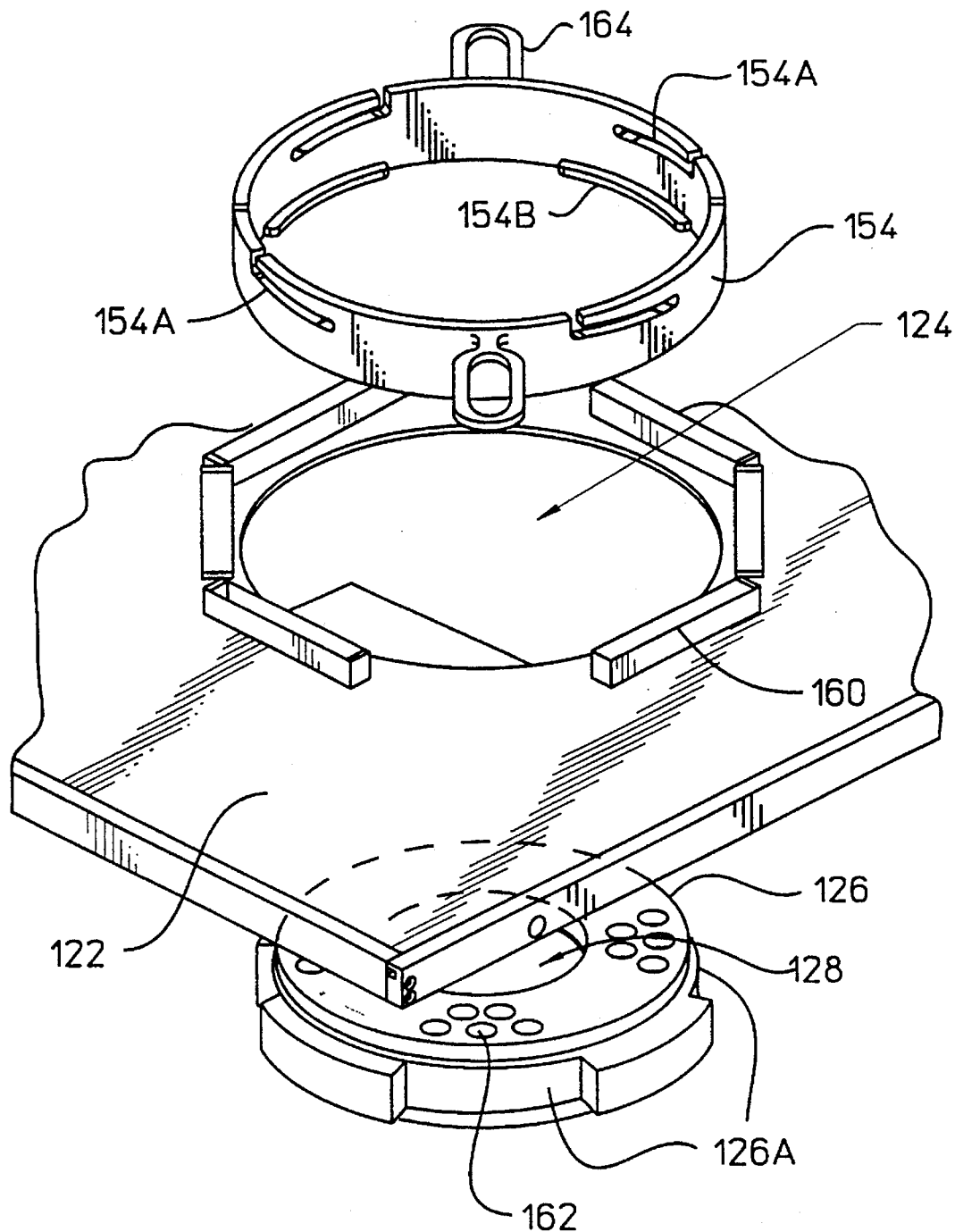
FIG. 4 is an exploded detail of the load board, a cam ring, and a connector support disk incorporated into the test head of the electronic circuit test system shown in FIG. 2.

As shown in FIG. 2, the test head 106 comprises a load board 122 selectively mounted to the test head and having an aperture 124. The test head 106 further comprises a connector support disk 126 mounted to the test head within the aperture 124. The connector support disk 126 has a plurality of peripheral notches 126A, as shown in FIG. 4. The connector support disk 126 also has an opening 128. As shown in FIG. 2, the connector support disk 126 is peripherally mounted with respect to a tunnel 130 through the test head 106, and the opening 128 of the connector support disk is aligned with the tunnel.

Figure 5:
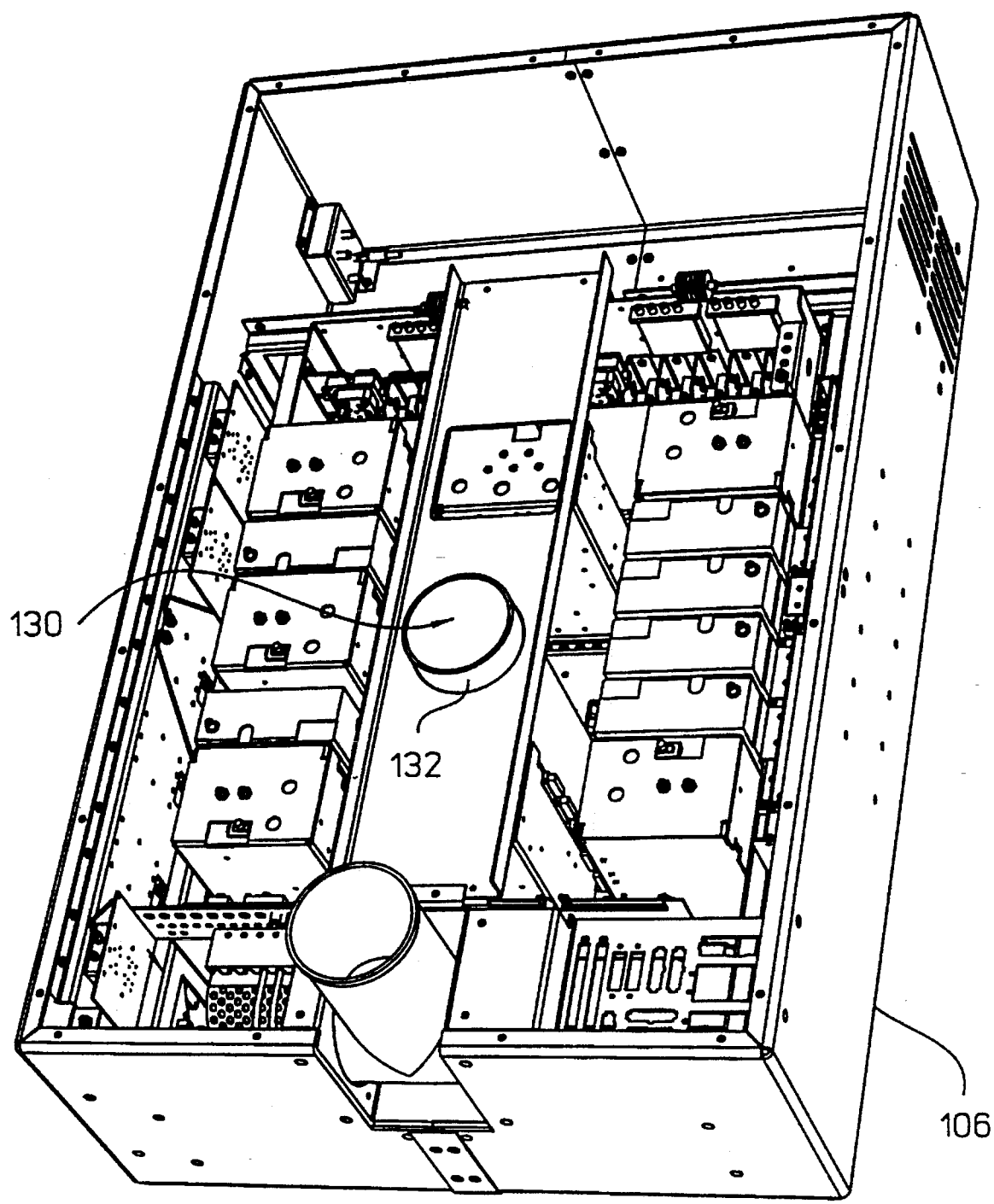
FIG. 5 is an isometric view of the obverse of the test head shown in FIG. 2.

As shown in FIGS. 2 and 5, the tunnel 130 extends entirely through the test head 106. In one implementation, the tunnel 130 can consist of a tube 132 that extends from the opening 128 in the connector support disk 126 through the back of the test head 106. The tunnel 130 enables an operator stationed behind the test head 106 to view through the test head from the rear of the test head.

Referring again to FIGS. 2 and 3, the docking system 100 comprises a spider 134 connected to the pulldown ring 112 of the fixture board 104. The spider 134 can be constructed from aluminum, for example. The spider 134 comprises an annulus 136 having a plurality of radial spokes 138. Each spoke 138 has an end 138A distal from the annulus 136. The distal end 138A of each spoke 138 has a threaded hole 140. The pulldown ring 112 has a plurality of holes 142 for alignment with the spokes 138 of the spider 134. A plurality of screws 144 inserted through the holes 142 in the pulldown ring 112 and screwed into the threaded holes 140 in the distal ends 138A of the spokes 138 of the spider 134 mounts the spider to the pulldown ring. As indicated by the arrow in FIG. 6, the face of each spoke 138 of the spider 134 opposite the fixture board 104 is preferably relieved intermediate the annulus 136 and the distal end 138A to enable electrical components to be mounted to the fixture board between the fixture board and the spider.

As shown in FIGS. 2 and 3, the docking system 100 also comprises male docking means preferably in the form of a docking cone 146 having a first end 146A and a second end 146B. The docking cone 146 can be constructed from Delrin, for example. The second end 146B of the docking cone 146 is mounted to the spider 134. In one implementation, the second end 146B of the docking cone 146 has a shoulder 146C so that the second end of the docking cone interfits into the annulus 136. Additionally, the annulus 136 has a plurality of holes 148 through the annulus. The second end 146B of the docking cone 146 has a plurality of threaded holes 150. A plurality of screws 152 inserted through the holes 148 in the annulus 136 and screwed into the threaded holes 150 in the second end 146B of the docking cone 146 mounts the docking cone to the spider 134.

As shown in FIG. 2, the first end 146A of the docking cone 146 is configured to interfit in female docking means preferably in the form of the opening 128 in the connector support disk 126 and the tunnel 130 in the test head 106 when the fixture board 104 is moved toward the test head. In one implementation, as shown in FIGS. 2, 3, and 4, the opening 128 in the connector support disk 126 is circular, and the docking cone 146 has a circular cross-section. The first end 146A of the docking cone 146 is tapered outwardly toward the second end 146B of the docking cone. That is, the first end 146A of the docking cone 146 has a first diameter d, and the second end 146B of the docking cone has a second diameter D. The first diameter d is less than the second diameter D, and the second diameter is slightly less than the diameter of the opening 128 in the connector support disk 126.

In operation, the docking system 100 facilitates engagement of the fixture board 104 with the test head 106. As the fixture board 104 is moved toward the test head 106, the first end 146A of the docking cone 146 enters the opening 128 in the connector support disk 126. Since the docking cone 146 is tapered outwardly from the first end 146A to the second end 146B, the docking cone is self-centering with respect to the opening 128. As the fixture board 104 continues to move toward the test head 106, the first end 146A of the docking cone 146 proceeds into the tunnel 130 in the test head 106. Since the docking cone 146 is self-centering within the opening 128 of the connector support disk 126, the second end 146B of the docking cone is guided into the opening in the connector support disk and seats within the opening in the connector support disk.

Additionally, as shown in FIGS. 2 and 4, in order to install the fixture board 104 having the DUT board 108 with the socket 110 on the test head 106, the test head preferably comprises a cam ring 154 for selectively engaging the pulldown ring 112 on the fixture board and the connector support disk 126 and actuable to interconnect the fixture board to the test head. The cam ring 154 has a plurality of bayonet slots 154A. The pulldown pins 120 of the pulldown ring 112 mounted to the fixture board 104 engage in the bayonet slots 154A of the cam ring 154. The cam ring 154 also has a plurality of tabs 154B that pass through the notches 126A of the connector support disk 126 when the cam ring is mounted to the test head 106.

As the fixture board 104 is moved toward the test head 106 and the docking cone 146 enters the opening 128 in the connector support disk 126 and the tunnel 130 in the test head, the pulldown pins 120 on the pulldown ring 112 are guided toward the bayonet slots 154A of the cam ring 154. When the pulldown pins 120 of the pulldown ring 112 are lodged in the bayonet slots 154A of the cam ring 154, rotation of the cam ring causes axial movement of connectors 156 and 158 mounted to the fixture board 104 toward mating connectors 160 and 162 mounted to the load board 122 and the connector support disk 126, respectively, for effecting electrical connection between the socket 110 and the test head 106. Also, as the cam ring 154 is rotated, the tabs 154B rotate away from the notches 126A and are captured beneath the periphery of the connector support disk 126, whereby a gun breech connection is formed. The cam ring 154 preferably comprises at least one handle 164 on the periphery of the cam ring which can be grasped by the operator to rotate the cam ring.

In one preferred embodiment of the docking system 100 in accordance with the invention, as shown in FIGS. 2 and 3, the pulldown ring 112 further comprises a plurality of holes 166. Additionally, the connector support disk 126 comprises a plurality of tapered dowel pins 168 that interfit in respective holes 166 in the pulldown ring 112 as the docking cone 146 guides the fixture board 104 toward the test head 106. Consequently, the docking cone 146 provides gross alignment of the fixture board 104 with respect to the load board 122 and the connector support disk 126, and the tapered dowel pins 168 provide precise alignment so that the connectors 156 and 158 mounted to the fixture board mate with connectors 160 and 162 mounted to the load board 122 and the connector support disk 126, respectively, for effecting electrical connection between the socket 110 and the test head 106. Mechanical connection between the fixture board 104 and the test head 106 is provided when the cam ring 154 is rotated due to engagement of the pulldown pins 120 of the pulldown ring 112 in the bayonet slots 154A of the cam ring, on the one hand, and the gun breech connection between the tabs 154B of the cam ring and the periphery of the connector support disk 126, on the other hand.

As shown in FIG. 6, the docking system 100 in accordance with one embodiment of the invention is configured to facilitate interfacing the electronic circuit test system 102 to an automated material handler which feeds packaged devices and integrated circuits to the test system. In one implementation of the invention, the fixture board 104 is attached to the output of an electronic circuit handler 170, such as a Daymarc 717 MonoRail integrated circuit handler, for feeding a packaged device or integrated circuit to the socket 110. In accordance with another embodiment of the invention shown in FIG. 7, the docking system 100 in accordance with the invention is configured to facilitate interfacing the electronic circuit test system 102 to a wafer probing station 172 which probes devices or integrated circuits on wafer.

The docking system 100 in accordance with the various embodiments of the invention provides repeatable interconnection of the fixture board 104 to the test head 106. The docking system 100 also minimizes the risk of damage to the connectors 156 and 158 mounted to the fixture board 104 and the respective connectors 160 mounted to the load board 122 and the connectors 162 mounted to the connector support disk 126, as well as reduces the risk of fracture of the tapered dowel pins 168. It will be understood and appreciated that the embodiment of the docking system 100 in accordance with the invention described above is susceptible to various modifications, changes, and adaptations. For example, the DUT board 108 can be integrated into the fixture board 104, rather than comprising a separate element incorporated into the fixture board. Additionally, the arrangement of structure corresponding to the docking cone 146 and spider 134 and structure corresponding to the opening 128 can be switched such that the docking cone and spider are mounted to the test head 106 and a receiving aperture is formed on the fixture board 104 which faces the test head. Alternatively, an inwardly tapered lip could be formed on the periphery of the connector disk 126 to correspond to the docking cone 146 and spider 134, and the tapered lip would be self-centering within the pulldown ring 112, that is, the interior of the pulldown ring would correspond to the opening 128.

Although the foregoing description discloses an electronic circuit test system which measures high-frequency electrical signals, many of the principles of the invention also apply in general to electronic circuit testers. All is intended to be comprehended within the meaning and range of equivalents of the appended claims.

What is claimed is:

1. A system for docking a fixture board of an electronic circuit test system to a test head of the test system, the fixture board comprising at least one electrical connector mounted to the fixture board, the test head comprising a load board selectively mounted to the test head and having an aperture, a connector support disk mounted to the test head within the aperture, the connector support disk having an opening, the test head further comprising a tunnel through the test head aligned with the opening, and at least one mating electrical connector mounted to the lcad board or the connector support disk, the docking system comprising:

male docking means mounted to one of the fixture board and the test head, the male docking means comprising:

a pulldown ring comprising a plurality of pulldown pins;

a spider connected to the pulldown ring; and a docking cone having a first end and a second end, the second end of the docking cone being mounted to the spider; and female docking means mounted to the other of the fixture board and the test head, the female docking means comprising a cam ring for selectively engaging the pulldown ring on the male docking means and actuable to interconnect the fixture board to the test head;

the male docking means being configured to interfit in the female docking means when the fixture board is moved toward the test head to facilitate engagement of the at least one electrical connector of the fixture board with the at least one mating electrical connector of the test head.

2. The docking system of claim 1 wherein the cam ring comprising a plurality of bayonet slots into which are guided respective pulldown pins when the fixture board is moved toward the test head and wherein the connector support disk is peripherally mounted with respect to the tunnel in the test head, the connector support disk having a plurality of peripheral notches and the cam ring having a plurality of tabs that pass through the notches when the cam ring is mounted to the test head and at least one handle on the periphery of the cam ring to rotate the cam ring when the pulldown pins are guided into the bayonet slots so that the tabs rotate away from the notches and are captured beneath the periphery of the connector support disk, whereby a gun breech connection is formed.

3. The docking system of claim 2, further comprising a plurality of holes in the pulldown ring and a plurality of tapered dowel pins on the connector support disk that interfit in respective holes in the pulldown ring as the docking cone guides the fixture board toward the test head.

4. A system for docking a fixture board of an electronic circuit test system to a test head of the test system, the fixture board comprising at least one electrical connector mounted to the fixture board, the test head comprising a lcad board selectively mounted to the test head and having an aperture, a connector support disk mounted to the test head within the aperture, the connector support disk having an opening, the test head further comprising a tunnel through the test head aligned with the opening, and at least one mating electrical connector mounted to the lcad board or the connector support disk, the docking system comprising:

male docking means mounted to one of the fixture board and the test head, the male docking means comprising:

a pulldown ring comprising a plurality of pulldown pins;

a spider connected to the pulldown ring, wherein the spider comprises an annulus having a plurality of radial spokes, each spoke having an end distal from the annulus, the distal end of each spoke having a threaded hole, the periphery of the pulldown ring having a plurality of holes for alignment with the spokes of the spider, and further comprising a plurality of screws inserted through the holes in the periphery of the pulldown ring and screwed into the threaded ends of the spokes for mounting the spider to the pulldown ring; and a docking cone having a first end and a second end, the second end of the docking cone being mounted to the spider; and female docking means mounted to the other of the fixture board and the test head;

the male docking means being configured to interfit in the female docking means when the fixture board is moved toward the test head to facilitate engagement of the at least one electrical connector of the fixture board with the at least one mating electrical connector of the test head.

5. The docking system of claim 4 wherein the face of each spoke of the spider is opposite the fixture board and is relieved intermediate the annulus and the distal end to enable electrical components to be mounted to the fixture board between the fixture board and the spider.

6. A system for docking a fixture board of an electronic circuit test system to a test head of the test system, the fixture board comprising at least one electrical connector mounted to the fixture board, the test head comprising a load board selectively mounted to the test head and having an aperture, a connector support disk mounted to the test head within the aperture, the connector support disk having an opening, the test head further comprising a tunnel through the test head aligned with the opening, and at least one mating electrical connector mounted to the load board or the connector support disk, the docking system comprising:

male docking means mounted to one of the fixture board and the test head, the male docking means comprising:

a pulldown ring comprising a plurality of pulldown pins;

a spider connected to the pulldown ring, wherein the spider comprises an annulus having a plurality of radial spokes each having a distal end mounted to the pulldown ring, and the docking cone has a circular cross-section, the first end of the docking cone being tapered outwardly toward the second end of the docking cone, the first end of the docking cone having a first diameter and the second end of the docking cone having a second diameter, the first diameter being less than the second diameter, the second diameter being less than a diameter of the opening in the connector support disk, the second end of the docking cone being mounted to the annulus; and a docking cone having a first end and a second end, the second end of the docking cone being mounted to the spider; and female docking means mounted to the other of the fixture board and the test head;

the male docking means being configured to interfit in the female docking means when the fixture board is moved toward the test head to facilitate engagement of the at least one electrical connector of the fixture board with the at least one mating electrical connector of the test head.

7. The docking system of claim 6 wherein the second end of the docking cone has a shoulder so that the second end of the docking cone interfits into the annulus, and further comprising a plurality of holes through the annulus and a plurality of threaded holes in the second end of the docking cone and a plurality of screws inserted through the holes in the annulus and screwed into the threaded holes in the docking cone for mounting the docking cone to the spider.

8. The docking system of claim 6 wherein the face of each spoke of the spider is opposite the fixture board and is relieved intermediate the annulus and the distal end to enable electrical components to be mounted to the fixture board between the fixture board and the spider.

9. The docking system of claim 7 wherein the face of each spoke of the spider is opposite the fixture board and is relieved intermediate the annulus and the distal end to enable electrical components to be mounted to the fixture board between the fixture board and the snider.

* * * * *